US006580611B1

United States Patent
Vandentop et al.

(10) Patent No.: US 6,580,611 B1
(45) Date of Patent: Jun. 17, 2003

(54) DUAL-SIDED HEAT REMOVAL SYSTEM

(75) Inventors: Gilroy J. Vandentop, Tempe, AZ (US); Raj Nair, Gilbert, AZ (US); Chia-Pin Chiu, Tempe, AZ (US); Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/126,200

(22) Filed: Apr. 19, 2002

Related U.S. Application Data

(63) Continuation-in-part of application No. 10/026,145, filed on Dec. 21, 2001, now abandoned.

(51) Int. Cl.[7] .................................................. H05K 7/20
(52) U.S. Cl. ........................ 361/704; 361/707; 361/709; 361/717; 361/718; 361/719; 257/706; 257/707; 257/712; 257/713; 165/80.3; 165/185
(58) Field of Search ................................ 361/703, 704, 361/707, 709, 718–721, 760, 761–767, 769, 782–785; 257/706, 707, 718, 719, 698, 720; 174/16.3; 165/80.3, 185

(56) References Cited

U.S. PATENT DOCUMENTS

| | | | | |
|---|---|---|---|---|
| 5,473,510 A | * | 12/1995 | Dozier, II | 361/719 |
| 5,671,121 A | * | 9/1997 | McMahon | 361/719 |
| 5,825,625 A | * | 10/1998 | Esterberg et al. | 361/719 |
| 5,990,550 A | * | 11/1999 | Umezawa | 257/712 |
| 6,181,567 B1 | * | 1/2001 | Roemer et al. | 361/760 |
| 6,229,216 B1 | * | 5/2001 | Ma et al. | 257/777 |
| 6,286,208 B1 | * | 9/2001 | Shih et al. | 29/879 |
| 6,366,467 B1 | * | 4/2002 | Patel et al. | 361/760 |
| 6,392,296 B1 | * | 5/2002 | Ahn et al. | 257/698 |
| 6,407,924 B1 | * | 6/2002 | Brodsky | 361/704 |

* cited by examiner

Primary Examiner—Boris Chervinsky
(74) Attorney, Agent, or Firm—Kenyon & Kenyon

(57) ABSTRACT

The present invention describes a method and apparatus for mounting a microelectronic device parallel to a substrate with an interposer and two heat sinks, one on each side of the substrate.

31 Claims, 3 Drawing Sheets

DUAL-SIDED HEAT REMOVAL SYSTEM

RELATED APPLICATIONS

This application is a continuation-in-part related to Ser. No. 10/026,145, filed on Dec. 21, 2001 now abandoned.

FIELD OF THE INVENTION

The present invention relates to heat removal in a computer system. More particularly, the present invention relates to dual-sided heat sinks for microelectronic devices mounted parallel to a substrate.

BACKGROUND OF THE INVENTION

As the speed and component density of modern microelectronic devices continues to increase, the heat generated by them also generally increases. Techniques for better dissipating the heat from microelectronic devices are thus desirable, especially with higher performance devices. The term microelectronic device, as used in this disclosure, is intended to be broad and include, but not be limited to, electronic and opto-electronic devices such as microprocessors, application specific integrated circuits (ASICs), chipsets, and the like. Although for clarity, the term microelectronic device is used in the singular, it is also intended to include a plurality of individual devices.

In virtually all systems using electronic components, the microelectronic device is mounted on a substrate which facilitates the distribution of electrical signals, as well as power and ground, between the microelectronic device and other system components. However, the substrates are often not made of material that is a particularly good thermal conductor. Examples of such substrates include organic land grid arrays (OLGAs), plastic land grid arrays (PLGAs), and printed circuit boards (PCBs). The present invention is not, however, intended to be limited to embodiments using any particular substrate material or device mounting configuration.

It would be desirable to be able to provide cooling on both sides of the device while eliminating the large thermal barrier of the substrate.

DETAILED DESCRIPTION

Figure 1:
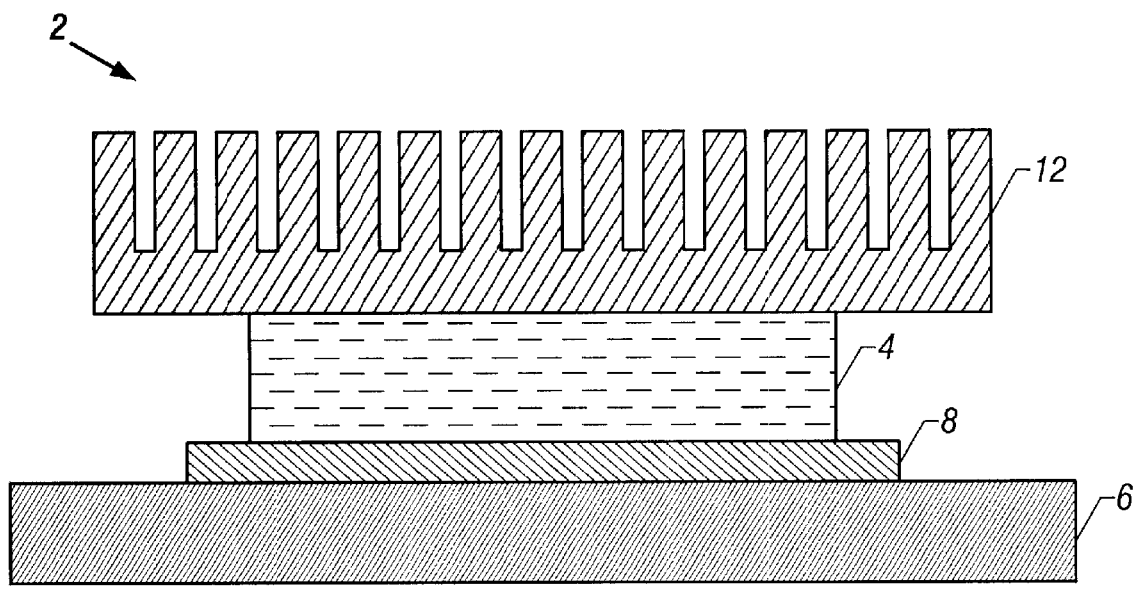
FIG. 1 depicts a cross section through a microelectronic device and heat sink mounted on a substrate using a socket connection.

The present invention allows double-sided heat sinks in systems with microprocessors mounted parallel to the substrate, allowing up to twice the heat dissipation of the prior art. Substrates are often poor thermal conductors so, heat cannot easily be dissipated in the direction of the substrate. FIG. 1 depicts a cross section of one configuration 2 used to mount a microelectronic device 4 on a substrate 6. Use of a socket 8 to electrically and mechanically couple microelectronic device 4 to substrate 6 is common. Given the relatively poor thermal conductivity of substrate 6, one can easily see that most of the heat generated in configuration 2 by microelectronic device 10 will be dissipated through heat sink 12. The design of heat sinks such as heat sink 12 is known to those of ordinary skill in the art, and the present invention is not intended to be limited to any particular heat sink design details such as, but not limited to, the material or geometry used for the heat sink.

The present invention uses an interposer device, discussed further below, for mounting the microelectronic device, with an opening in the substrate that allows a second heat sink to be included on the substrate side of the microelectronic device.

A recent development in the art of mounting microelectronic devices is the use of an interposer between microelectronic device 4 and substrate 6. For the purposes of the present disclosure the term interposer will be used in the broadest sense: a device interposed, or located between microelectronic device 4 and substrate 6. In this sense, socket 8 in FIG. 1 is one form of interposer. For use with the present invention the interposer will preferably have high thermal conductivity, for reasons that will be explained below. Note that for purposes of the present invention, the internal design details of the particular interposer are not important. Furthermore, the present invention is not intended to be limited to use with any particular interposer design, providing it is thermally conductive. Neither is the design of the interposer the subject of the present invention, only that an interposer, as is broadly defined, be used with the present invention. With that in mind, the present disclosure will functionally describe a few of the many possible interposer designs to better appreciate the context of the present invention, and in no way intends to limit the scope of the invention to use with the described interposers.

Connecting a microelectronic device 4 and a substrate 6 using socket 8 has been common practice for many years. However, socket 8 is traditionally just a means of mechanical and electrical connection, it is not a component in which the electrical signals or power were processed or transformed, but rather one where signals are "passed through." As microelectronic devices 4 progressed in terms of speed and general processing power, while operating at lower voltages, the need to better control the quality of power as well as input and output (I/O) signals of microelectronic devices 4 became apparent. For example, IR drops in high current and low voltage situations, particularly in the context of high dI/dT signals, are undesirable and degrade processor performance. Prior art solutions to such "power problems" often used techniques such as land side capacitors located directly on substrate 6 for power decoupling.

One solution to the power which will improve the quality of the power signals supplied to the processor is providing an interposer, coupled directly to microelectronic device 4, containing a voltage regulation (VR) system. In this way, relatively high voltages can be supplied to the interposer device, which is immediately adjacent to the processor, and the voltage is reduced within the interposer and distributed to microelectronic device 4.

Figure 2:
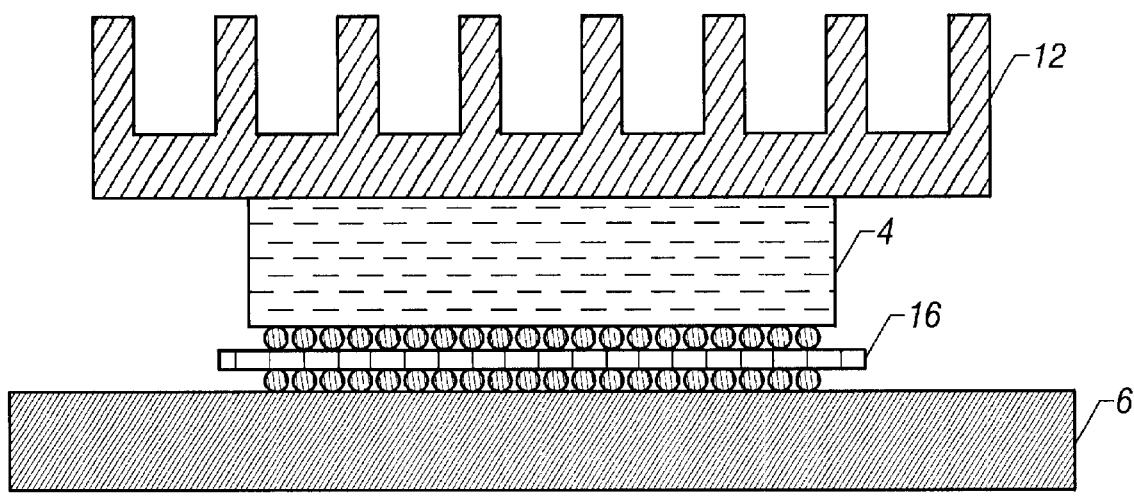
FIG. 2 depicts a microelectronic device and heat sink mounted on a substrate using an interposer.

FIG. 2 illustrates one arrangement with a thin interposer 16 mounted between microelectronic device 4 and substrate 6, and heat sink 12. Although microelectronic device 4 and interposer 16 are shown in FIG. 2 as being approximately the same size, there is no requirement that they be so. Signals travelling between substrate 6 and microelectronic device 4 might be routed within the plane of interposer 16, or "horizontally" in FIG. 2, such as to or from the VR system as well as "vertically" through vias in interposer 16.

Figure 3:
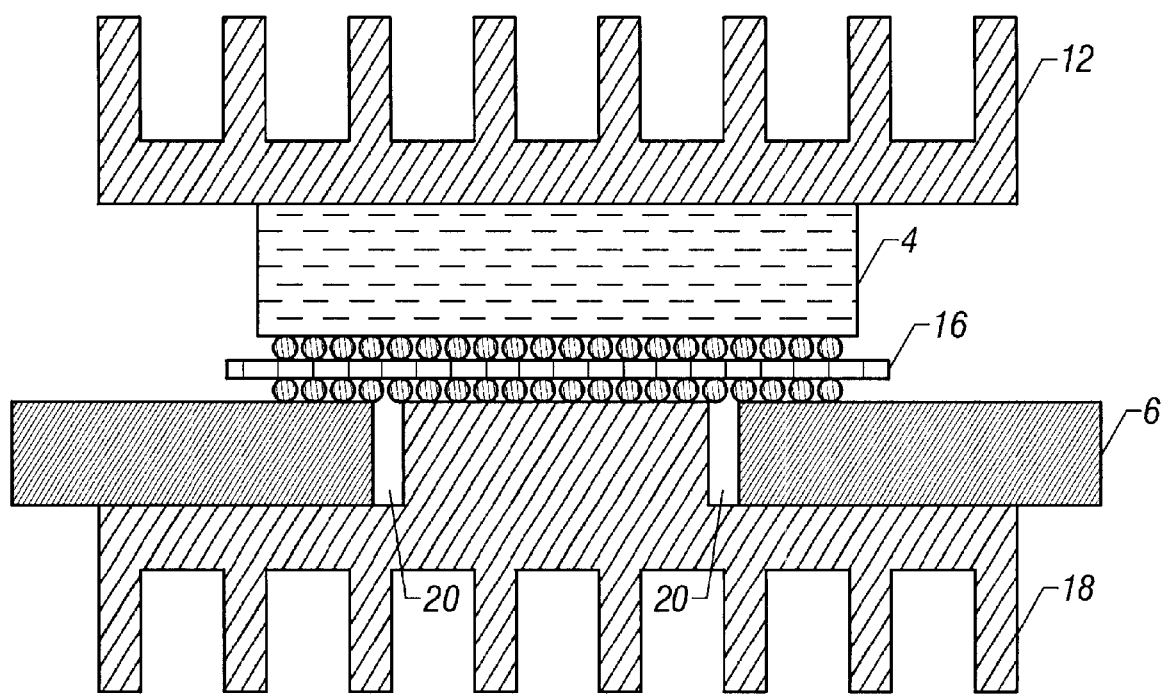
FIG. 3 shows a microelectronic device and interposer mounted on a substrate with two heat sinks in accordance with an embodiment of the present invention.

The present invention exploits the ability of interposer 16 to distribute electrical signals within its plane, and allows an opening in substrate 6 which may also facilitate a second heat sink. FIG. 3 shows an embodiment of the present invention with a second heat sink 18 mounted through an opening 20 in substrate 6. In this embodiment there are two major heat transfer paths to two heat sinks, 12 and 18, significantly increasing the ability to dissipate heat from microelectronic device 4. Heat sinks 12 and 18 may be similar, or they may use different materials and/or configurations. Interposer 16 by providing a path for electrical signals between microelectronic device 4 and substrate 6, as well as to providing mechanical support for microelectronic device 4, allows opening 20 to be created in substrate 6 for the second heat transfer path through substrate 6. Thus, the present invention may use interposer 16 to solve both the "power problem" and the "thermal problem."

Figure 4:
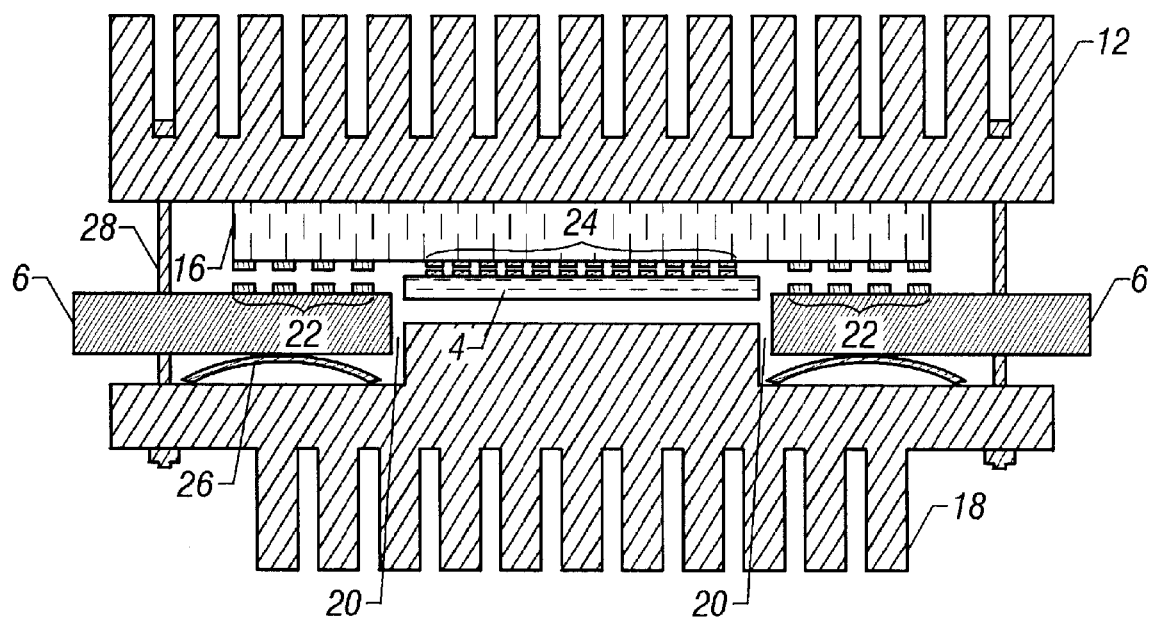
FIG. 4 shows another dual heat sink assembly in accordance with an embodiment of the present invention.

FIG. 4 illustrates another embodiment of the present invention with microelectronic device 4 mounted below interposer 16, and through opening 20 in substrate 6, with two heat sinks, 12 and 18, on opposite sides of substrate 6. The electrical connections 22 between substrate 6 and interposer 16 are preferably gold plated copper pads, with copper to copper connections 24 between microelectronic device 4 and interposer 16. The use of spring plates 26 and connecting rods 28 in this embodiment allow for a socket-less pressure mated assembly of the components, while providing secure electrical connections. The surfaces of heat sinks 12 and 18 in contact with microelectronic device 4 and interposer 16 are preferably prepared with a highly thermally conductive thermal interface.material (TIM) such as a polymer-based, solder-based, or diamond paste. Such TIMs are known to those of ordinary skill in the art. Note that the embodiment shown in FIG. 4 is only one of many possible arrangements of microelectronic device 4 and interposer 16 which permits heat sinks on both sides of substrate 6, and the present invention is not intended to be limited to any particular design details.

Figure 5:
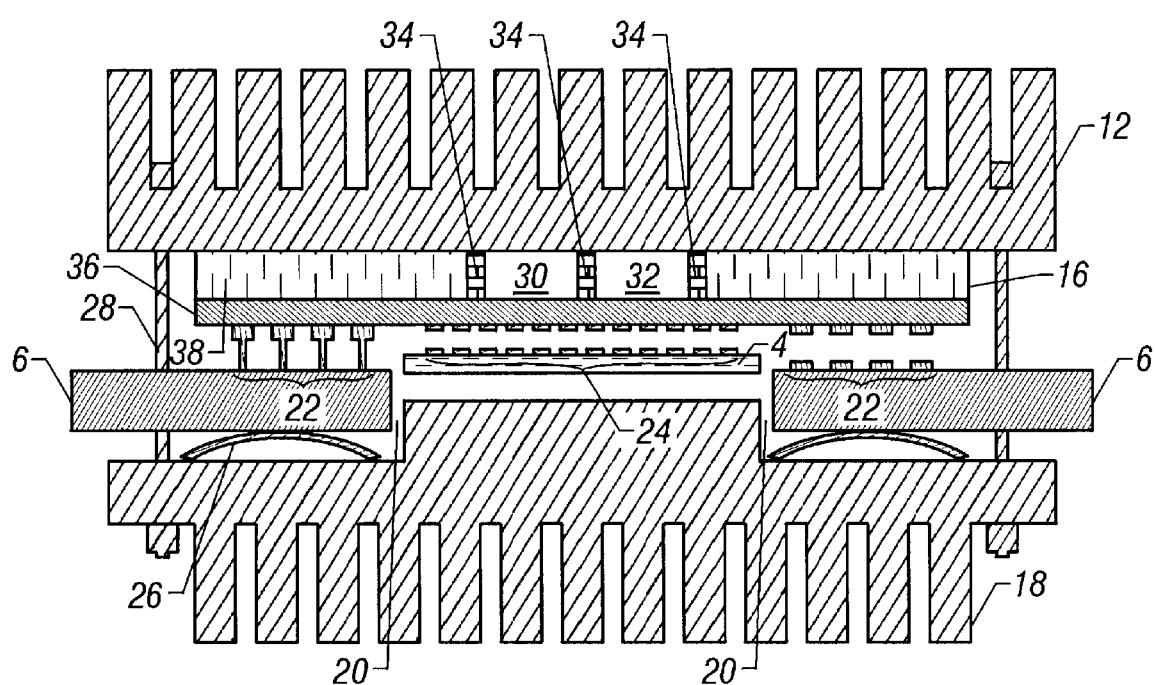
FIG. 5 shows a third dual heat sink assembly in accordance with an embodiment of the present invention.

The design of interposer 16 is not intended to be limited to aiding in voltage regulation and mechanically bridging opening 20. Other embodiments of the present invention might also incorporate memory devices, optical signal propagation devices, as well as components such as capacitors and inductors within interposer 16. FIG. 5 shows an embodiment of the present invention in which two silicon dice, 30 and 32, are embedded within interposer 16. Embedded dice 30 and 32 are preferably surrounded by, and held in place by, encapsulation material 34 within a core 38. Build up layers 36 on the microelectronic device 4 side of interposer 16 contact power and I/O signals within interposer 16 and between sets of connections 22 and 24. The relative sizes of microelectronic device 4, and dies 30 and 32 embedded in the interposer may vary and can be selected to optimize both the electrical and thermal performance of interposer 16. FIG. 5 is shown with two different configurations of contacts 22 between substrate 6 and interposer 16, pins and contact pads, to illustrate two of the many possible ways of electrically coupling the two components. However, the present invention is not intended to be limited to any particular electrical connection, or any other design detail, except as limited by the terms of claims.

Unlike an inactive socket 8, an interposer 16 with active components generates heat, although, typically much less than is generated by microelectronic device 4. The thermal solution provided by the dual heat sinks (12 and 18) of the present invention not only provides a thermal path for the heat load from interposer 16, but also typically dissipates a portion of the heat from microelectronic device 4 through interposer 16 to the second heat sink. Tests using thermal loads of 120 watts and 30 watts for microelectronic device 4 and interposer 16, respectively, show that about 40% of the heat from microelectronic device 4 is dissipated through the heat sink attached to interposer 16. This second heat transfer path may significantly reduce the operating temperature of both microelectronic device 4 and interposer 16, thereby increasing the performance of both.

Although the above disclosure provides various embodiments and examples of the present invention for the purposes of illustration, these embodiments and examples are not intended to be an exhaustive list of all possible implementations of the present invention and should not be construed in limiting the present invention. Those of ordinary skill in the art should recognize, with the benefit of the present disclosure, that the present invention may be practiced with many modifications and variations to the specific details of the present disclosure. Similarly, not all the specific details, well-known structures, devices, and techniques that are known to those of ordinary skill in the art have been shown in order to avoid observing the present invention. The present invention is, however, intended to cover a broad range of techniques, devices, and well-known structures. The invention, therefore, is intended to be limited in scope only by the purview of the appended claims.

What is claimed is:

1. In an assembly with a microprocessor mounted parallel to a printed circuit board (PCB) a dual-sided heat removal apparatus, comprising:
   an interposer electrically coupled to both the microprocessor and the PCB for passing electrical signals between the microprocessor and the PCB;
   a first heat sink thermally coupled to the microprocessor and extending through an opening in the PCB for dissipating heat; and
   a second heat sink thermally coupled to said interposer for dissipating heat.

2. An apparatus in accordance with claim 1, wherein:
   said first and second heat sinks are made substantially of aluminum.

3. An apparatus in accordance with claim 1, wherein:
   said first and second heat sinks are made substantially from copper.

4. An apparatus in accordance with claim 1, wherein:
   said first and second heat sinks are made substantially from an aluminum-copper composite.

5. An apparatus in accordance with claim 1, wherein:
   said first and second heat sinks are made substantially from a thermally conductive composite material.

6. An apparatus in accordance with claim 1, wherein:
   said interposer includes a voltage regulation (VR) system.

7. An apparatus in accordance with claim 1, wherein:
   said interposer includes memory.

8. An apparatus in accordance with claim 1, wherein:
   said intergrater includes an optical signaling system.

9. An apparatus in accordance with claim 1, wherein:
   said interposer and said microprocessor are coupled by a socket-less electrical connection.

10. An apparatus in accordance with claim 9, wherein:
    said interposer and said PCB are coupled by a socket-less electrical connection.

11. An apparatus in accordance with claim 1, wherein:
said interposer contains electrically active components.

12. In an assembly with a microprocessor mounted parallel to a printed circuit board (PCB), a dual sided heat removal apparatus, comprising:
   an interposer electrically coupled to both the microprocessor and the PCB for passing electrical signals between the microprocessor and the PCB;
   a first heat sink thermally coupled to said interposer and extending through an opening in the PCB for dissipating heat; and
   a second heat sink thermally coupled to the microprocessor for dissipating heat.

13. An apparatus in accordance with claim 12, wherein:
said first and second heat sinks are made substantially of aluminum.

14. An apparatus in accordance with claim 12, wherein:
said first and second heat sinks are made substantially from copper.

15. An apparatus in accordance with claim 12, wherein:
said first and second heat sinks are made substantially from an aluminum-copper composite.

16. An apparatus in accordance with claim 12, wherein:
said first and second heat sinks are made substantially from a thermally conductive composite material.

17. An apparatus in accordance with claim 12, wherein:
said interposer includes a voltage regulation (VR) system.

18. An apparatus in accordance with claim 12, wherein:
said interposer includes memory.

19. An apparatus in accordance with claim 12, wherein:
said interposer includes an optical signaling system.

20. An apparatus in accordance with claim 12, wherein:
said interposer and said microprocessor are coupled by a socket-less electrical connection.

21. An apparatus in accordance with claim 20, wherein:
said interposer and said PCB are coupled by a socket-less electrical connection.

22. An apparatus in accordance with claim 12, wherein:
said interposer contains electrically active components.

23. An apparatus for dissipating heat from a-microprocessor mounted on a printed circuit board (PCB), comprising:
   a first heat sink thermally coupled to the microprocessor, on the PCB side of the microprocessor, for dissipating heat from the microprocessor; and
   wherein said first heat sink extends through an opening in the PCB.

24. An apparatus in accordance with claim 23, further comprising:
   a second heat sink thermally coupled to an interposer for dissipating heat.

25. An apparatus for dissipating heat from a microprocessor connected to a printed circuit board (PCB) through an interposer, comprising:
   a first heat sink directly coupled, mechanically and thermally, to an interposer, on the PCB side of said interposer.

26. An apparatus in accordance with claim 25, further comprising:
   a second heat sink thermally coupled to the microprocessor for dissipating heat.

27. A method of cooling a microprocessor, comprising:
   electrically connecting the microprocessor to a PCB with an interposer;
   mounting the microprocessor and said interposer over an opening in said PCB;
   thermally connecting the microprocessor and said interposer to a pair of heat sinks; and
   wherein one of said pair of heat sinks extends through an opening in the PCB.

28. A method in accordance with claim 27, further comprising:
   regulating the electrical power supplied to the microprocessor with said interposer.

29. A method of cooling a microprocessor, comprising:
   dissipating heat from the microprocessor-interposer unit through a pair of heat sinks located on opposite sides of plane defined by the PCB; and
   connecting first of said pair of heat sinks directly to the microprocessor-interposer unit through an opening in the PCB.

30. A method in accordance with claim 29, further comprising:
   connecting second of said pair of heat sinks to the microprocessor interposer unit on the side opposite the PCB.

31. An apparatus in accordance with claim 25, wherein:
said interposer contains a silicon die.

* * * * *